United States Patent [19]

Lai

[11] Patent Number: 5,101,509
[45] Date of Patent: Mar. 31, 1992

[54] RF FILTER ALIGNMENT USING DIGITAL PROCESSOR CLOCK

[75] Inventor: June-San Lai, Oak Park, Mich.

[73] Assignee: Ford Motor Company, Dearborn, Mich.

[21] Appl. No.: 582,579

[22] Filed: Sep. 14, 1990

[51] Int. Cl.[5] .............................................. H04B 1/16
[52] U.S. Cl. ................................... 455/183; 455/197; 455/254; 455/340
[58] Field of Search .............. 455/165, 183, 185, 186, 455/193, 195-197, 226, 254, 339, 340

[56] References Cited

U.S. PATENT DOCUMENTS

| | | |
|---|---|---|
| 4,232,398 | 11/1980 | Gould et al. . |
| 4,334,323 | 6/1982 | Moore . |
| 4,368,541 | 8/1987 | Maier ................... 455/197 |
| 4,402,089 | 8/1983 | Knight et al. . |
| 4,481,673 | 11/1984 | Muterspaugh . |
| 4,590,611 | 5/1986 | Maier et al. . |
| 4,685,150 | 8/1987 | Maier . |
| 4,736,456 | 4/1988 | Maier . |
| 4,742,564 | 5/1988 | Dumont . |
| 4,792,993 | 12/1988 | Ma ........................................ 455/339 |
| 4,905,306 | 12/1990 | Anderson ........................... 455/340 |
| 4,919,640 | 4/1990 | Yanagibori ......................... 455/254 |
| 4,926,497 | 5/1990 | Shirley, Jr. et al. . |

*Primary Examiner*—Curtis Kuntz
*Attorney, Agent, or Firm*—Mark Mollon; Roger L. May

[57] ABSTRACT

A variable frequency RF passband filter is calibrated to maximize the sensitivity of a radio receiver using reference frequencies applied based on the clock operation of a digital processor within the receiver. The reference frequency passing through the variable passband filter is mixed to the intermediate frequency of the receiver and its level is detected. A frequency counter verifies that a measureable reference frequency signal has in fact been mixed to the intermediate frequency in order to avoid errors. The correct control voltage signal for the variable passband filter corresponding to each receiver frequency can thus be conveniently and inexpensively determined and stored for use during normal operation of the receiver.

9 Claims, 3 Drawing Sheets

RF FILTER ALIGNMENT USING DIGITAL PROCESSOR CLOCK

BACKGROUND OF THE INVENTION

The present invention relates in general to aligning the frequency response of a variable bandpass filter in a radio receiver, and more specifically to obtaining a reference frequency from a digital processor clock in an alignment procedure for a variable bandpass filter.

Radio wave receivers such as AM and FM radio, TV, and mobile transcievers simultaneously receive many different broadcast signals on their antennas. A desired signal must be separated from others in order to present it to the user of a receiver.

Any desired signal occupies a unique frequency range. Thus, a desired signal may, at least partially, be separated from other signals by connecting an antenna to a bandpass filter which attenuates all frequencies other than those in the desired frequency range. In order to selectively receive different frequency ranges (i.e., stations or channels), the .bandpass filter comprises a variable radio-frequency (RF) filter. One such variable filter includes voltage variable capacitors known as varactors, as well as fixed capacitors and fixed inductors in a bandpass configuration wherein a voltage applied to the varactors controls the resonant frequency (i.e., center frequency) of the filter. When tuning in a radio wave broadcast signal at a particular carrier frequency, a control voltage applied to the varactors causes the center resonant frequency of the RF filter to coincide with that carrier frequency.

Due to variability of characteristics of individual capacitors, inductors, and varactors used in constructing the RF filters, the filter response must be aligned (i.e., calibrated by frequency) for each individual receiver.

In order to find the precise control voltage to be applied to a filter to obtain a desired frequency response, a known reference frequency is typically applied to the input of the variable filter during the alignment procedure. The filter control voltage is then varied throughout its range in order to maximize the magnitude of the filter output. At maximum output, the frequency response of the variable filter is assumed to be properly aligned.

Alignment is preferably done automatically without use of external devices in order to save manufacturing time, labor, and cost. Prior art receivers with automatic alignment have obtained a reference frequency from either a local oscillator already present in the radio receiver or an auxiliary source dedicated to providing the reference frequency.

The use of extra hardware is undesirable, especially at higher frequencies such as within the FM band, television band, and mobile communication band because of high cost. If the local oscillator present in the receiver is used to provide the reference frequency, then the local oscillator is not available to perform its usual task of shifting the radio frequency signal to a lower intermediate frequency. In that case, the magnitude of the radio frequency signal must be measured and maximized. However, detection of the level of an RF signal can only be done in an inaccurate manner subject to many errors unless expensive and complicated extra hardware is employed.

SUMMARY OF THE INVENTION

It is a principal object of the present invention to provide method and apparatus for automatically aligning an RF filter using only a small number of relatively inexpensive parts.

It is a further object of the invention to avoid errors in aligning an RF filter.

Most modern radios include digital processors for controlling various components in an audio system and/or to digitally process the audio signal itself. These digital processors operate with clocks based on crystal oscillators which are highly stable and low in cost. By employing harmonic frequencies from the clock signal of a digital processor, several reference frequencies within a receiving band of a receiver can be provided using a single crystal oscillator. Since the local oscillator is not used to generate the reference frequency, the filter output signal resulting from the clock harmonic frequency is mixed down to an intermediate frequency prior to level detecting the magnitude of the filter output signal. The frequency of the mixed down signal is checked in order to avoid errors resulting from spurious signals.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with accompanying drawings, in which:

DETAILED DESCRIPTION OF PREFERRED EMBODIMENTS

Figure 1:
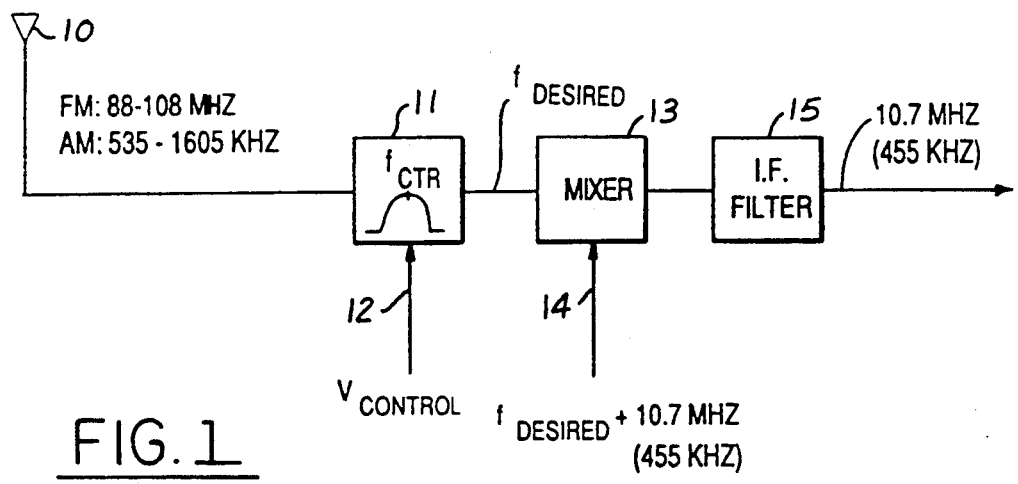
FIG. 1 is a block diagram showing a variable RF filter used in a/superheterodyne receiver of the present invention.

Referring to FIG. 1, a receiving antenna 10 is connected to the input of a variable RF filter 11. When tuning in FM broadcast signals, antenna 10 is used to receive signals ranging in frequency from 88 to 108 MHz. When tuning in AM broadcast signals, antenna 10 is used to receive signals ranging from 535 to 1605 KHz. In order to filter out unwanted broadcast signals, variable filter 11 receives a filter control voltage $V_{control}$ at a control input 12 in order to align the center frequency of the passband of the filter with the center frequency of the desired broadcast signal. The desired broadcast signal carrier frequency $f_{desired}$ Passed by variable filter 11 is input to a mixer 13. The mixer output is connected to the input of an intermediate frequency (IF) filter 15.

Mixer 13 receives a mixing signal 14 at another input which has a frequency equal to the sum of frequencies $f_{desired}$ plus the IF frequency. Typical intermediate frequencies are 10.7 MHz for FM and 455 KHz for AM (although lower IF frequencies in the range of 20–50 KHz may be preferable in order to reduce the cost of analog to digital conversion in the case of a DSP radio). IF filter 15 is a high quality fixed crystal filter for further attenuating undesired signals that passed through RF filter 11. It also filters out the image frequency generated in mixer 13 as is known in the art.

Figure 2:
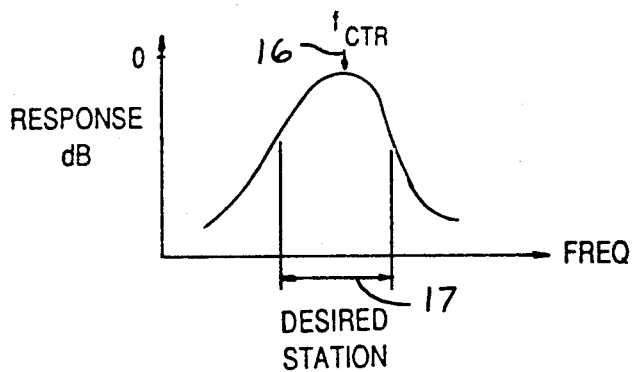
FIG. 2 is a plot showing proper alignment of a filter passband with a receiver radio signal.

In order to provide maximum sensitivity in the radio receiver, the center frequency of RF filter 11 must be properly aligned with the desired carrier frequency signal as determined by the mixer signal 14 provided to mixer 13. For example, as shown in FIG. 2, a frequency response of the passband RF filter includes a center frequency 16 denoted $f_{ctr}$. A broadcast signal to be received from a desired station occupies a frequency range 17 which in most commercial transmissions is centered on its carrier frequency (i.e., double sideband). In order to maximize the signal available to the receiver, center frequency $f_{ctr}$ should be aligned to fall at the center of frequency range 17.

Figure 3:
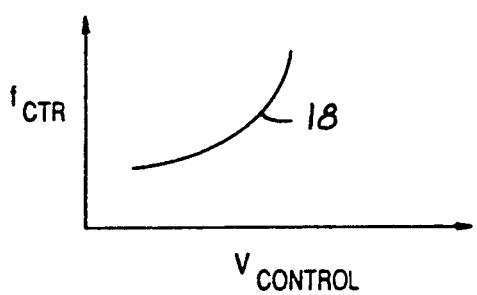
FIG. 3 shows a plot of a filter control voltage versus the center resonant frequency of the filter.

As shown in FIG. 3, alignment of the filter response is achieved by setting the control voltage $V_{control}$ to a DC voltage which is known to correspond to the desired center frequency $f_{ctr}$. However, due to the variability from one component part to another, the exact parameters of the control curve shown in FIG. 3 are not known in advance for an individual filter. The alignment process determines the proper control voltage $V_{control}$ which corresponds to each of the desired frequencies to be received.

Figure 4:
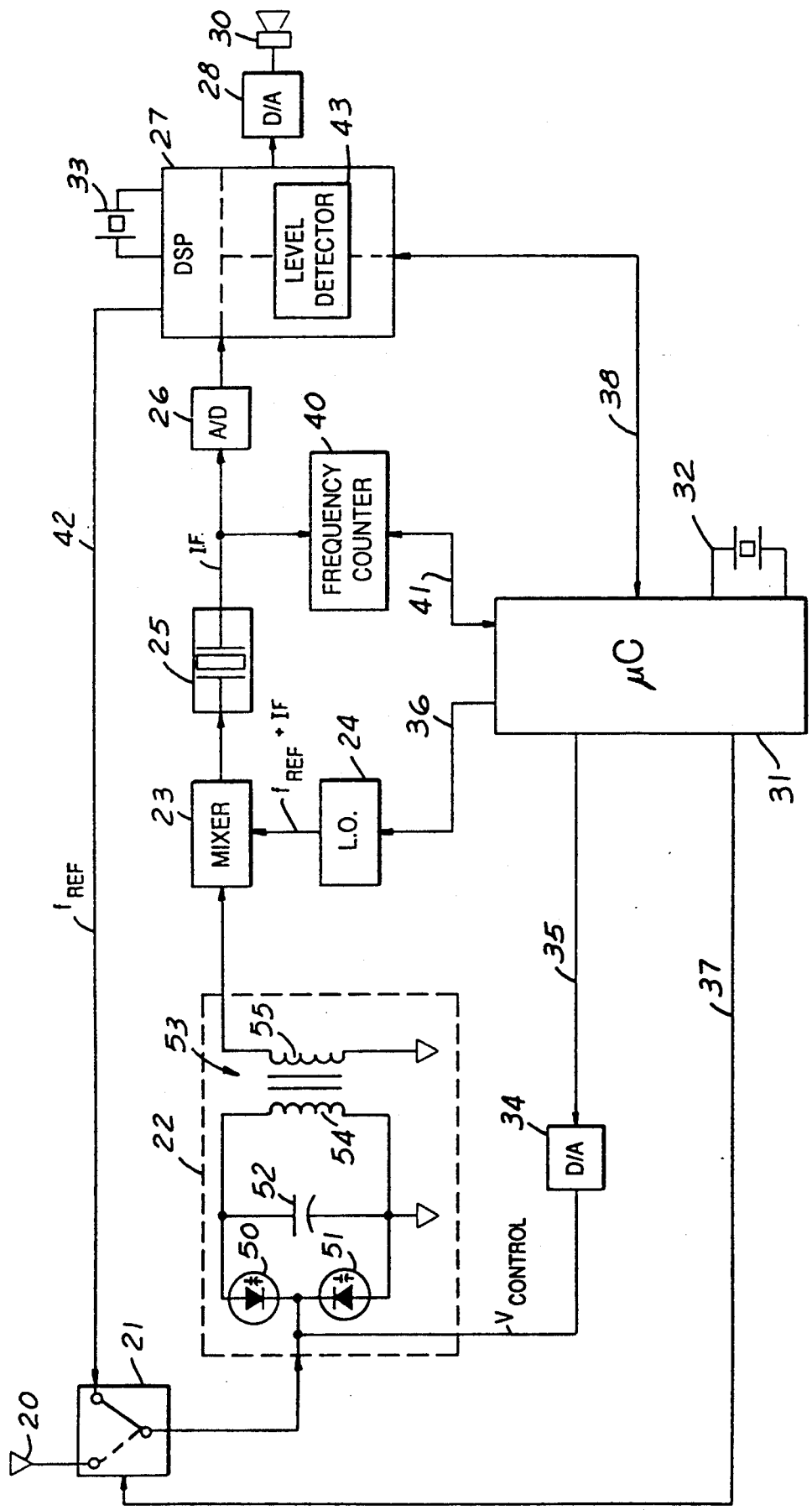
FIG. 4 is a block diagram showing a preferred embodiment of a receiver according to the present invention.

Turning to FIG. 4, a preferred embodiment of the present invention for automatically calibrating the filter control voltage is shown in connection with a microprocessor-controlled, digital signal processing (DSP) radio. An antenna 20 receives AM and/or FM broadcast signals which are coupled to one input of a switch 21. The output of switch 21 is connected to the input of a variable RF filter 22. A band limited RF signal is output from filter 22 to a mixer 23. The RF signal is mixed with a local oscillator signal from a local oscillator 24 to produce an IF signal which is passed through an intermediate frequency (IF) filter 25 to the input of an analog-to-digital (A/D) converter 26. IF filter 25 preferably comprises a piezoelectric crystal filter.

The digitized intermediate frequency signal from A/D converter 26 is coupled to a digital signal processor (DSP) block 27 for detection, stereo decoding, tone conditioning, amplification, and other processing. A digital audio signal is produced which is provided to the input of a digital-to-analog (D/A) converter 28 which produces an analog audio signal for driving a speaker 30.

DSP block 27 may include a DSP chip set or may include a single-chip DSP processor such as the TMS 320C25 from Texas Instruments, the ADSP-2100 from Analog Devices, or the NEC 7720 from Nippon Electric Company. Digital signal processors are being used in audio equipment such as radio receivers because of advantages in improved signal quality and signal-to-noise ratio, flexibility for implementing various types of signal processing, and lower cost. DSP block 27 includes a clock circuit (not shown) connected to an external piezoelectrical crystal 33. A DSP clock typically runs at a rate of about 10 MHz or higher.

A microcontroller 31 controls overall operation of the receiver and has a piezoelectric crystal 32 for implementing its own clock oscillator. Microcontroller 31 may be comprised of a COP888CG microcontroller from National Semiconductor Corporation, for example. Microcontroller 31 controls the center frequency setting of filter 22 by means of a D/A converter 34 which receives a digital command value from microcontroller 31 over a line or lines 35. D/A converter 34 provides an analog control voltage $V_{control}$ to the input line of filter 22.

Microcontroller 31 commands a desired mixing frequency to be produced by local oscillator 24 by sending a command over a line or lines 36. A control line 37 from microcontroller 31 to switch 21 carries a command signal for controlling the position of switch 21. Microcontroller 31 sends commands to DSP block 27 and receives data from DSP block 27 using lines 38. A frequency counter 40 is connected to the output of IF filter 25 and communicates with microcontroller 31 over line or lines 41. Frequency counter 40 may be comprised of the LC7217 frequency synthesizer from Sanyo Electric Company. Although local oscillator, mixer, IF filtering, frequency counting, analog to digital, and digital to analog conversion functions are shown as being separate, each could alternatively be implemented within either DSP block 27 or microcontroller 31. Furthermore, lines 35, 36, 37, 38, and 41 could all implemented by shared data and address busses.

RF filter 22 takes a form known in the art including a pair of varistors 50 and 51, each receiving the filter input signal at its cathode. A capacitor 52 and a primary winding 54 of a transformer 53 are connected between the anodes of varistors 50 and 51. The anode of varistor 51 is connected to ground. A secondary winding 55 of transformer 53 has one end connected to ground and the other end providing the output for RF filter 22.

RF filter 22 functions as a bandpass filter having a predetermined frequency width and having a center frequency controlled by the DC voltage present at the cathodes of varactors 50 and 51, i.e., $V_{control}$ which is provided by D/A converter 34. Thus, in order to receive the broadcast from a desired station, microcontroller 31 sends an appropriate frequency command to local oscillator 24 and sends a corresponding command to D/A converter 34 in order to align the passband of RF filter 22 with the station to be received.

DSP block 27 provides a clock signal on line 42 which is connected to the remaining input of switch 21. In order to achieve alignment of RF filter 22 using clock signals from DSP block 27, the clock signals must include frequencies within the band of broadcast frequencies which are to be received.

In the preferred embodiment for an FM receiver, the DSP clock signal from crystal 33 has a frequency of 10 MHz signals which has harmonic components falling within the FM band. The harmonic components are integral multiples of the fundamental frequency of the crystal oscillator but have reduced amplitude with increased order of harmonic. However, the harmonic components have been found to have sufficient magnitude to accomplish alignment according to the present invention. In order to align RF filter 22 with frequencies for AM reception, a frequency divider or other frequency generator in DSP block 27 can be employed to generate frequencies in the AM band from 535 to 1605 KHz.

In the alternative, the clock circuit in microcontroller 31 can be employed to generate the frequency reference signals to be applied to switch 21 and thereby to the input of RF filter 22.

To achieve frequency alignment of filter 22, microcontroller 31 selects a reference frequency $f_{ref}$ (either a harmonic frequency or a generated frequency from DSP block 27) falling within the reception band to applied to filter 22. For example, in the FM band, 90 MHz may be selected which is the ninth harmonic of a 10 MHz clock signal. Microcontroller 31 commands local oscillator 24 to oscillate at a frequency equal to the selected frequency ($f_{ref}$) plus the intermediate frequency (IF) at which the receiver operates. In this example, local oscillator 24 would be commanded to generate an oscillator signal at 100.7 MHz which corresponds to the 90 MHz reference signal plus 10.7 MHz corresponding to the standard intermediate frequency for FM receivers. Thus, the reference frequency signal passed through RF filter 22 will be mixed in mixer 32 to the intermediate frequency of the receiver.

Microcontroller 31 commands switch 21 on line 37 to connect the reference signal on line 42 to the input of RF filter 22. Switch 21 can be comprised of a small relay or a PIN diode switch. Microcontroller 31 also commands D/A converter 34 to output a control voltage $V_{control}$ preferably near the expected value which corresponds ideally to the reference frequency, or if that information is not available then to a voltage near the middle of its output range. Thus, the reference frequency signal is provided from line 42 through RF filter 22 and is mixed as a RF signal in mixer 23 to generate an IF signal which is filtered by IF filter 25. The filtered IF signal is inspected by frequency counter 40 to verify that a proper IF signal has in fact been generated. If an IF frequency signal is not detected, microcontroller 31 concludes that either the RF filter is so poorly aligned that the reference signal is completely blocked or that the presence of noise has disrupted the test. In either case, microcontroller 31 steps the control signal to RF filter 22 to the next value in a sequence to be described later. If a proper IF signal is detected by frequency counter 40, then microcontroller 31 commands DSP block 27 to detect the level of the resulting IF signal. A level detector 43 implemented in DSP block 27 receives the digitized IF filtered signal from A/D converter 26. The signal strength of the IF signal is determined and communicated to microcontroller 31 which stores the signal level in order to identify the control signal voltage $V_{control}$ which corresponds to the maximum IF signal level.

Level detector 43 determines signal level according to any of several methods known in the art and may be implemented either within DSP block 27 or by means of a separate circuit either in analog or digital form. In the preferred embodiment, level detector 43 operates within DSP block 27 to obtain in-phase (I) and quadrature (Q) components of the digitized IF signal. The I and Q components can be obtained using a digital Hilbert transform. The I and Q components are each squared and the square root of the sum of the squares is calculated to obtain the signal level.

Figure 5:
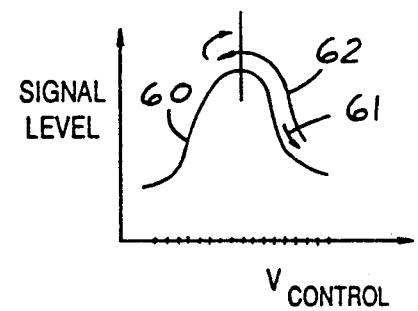
FIG. 5 is illustrates a technique for maximizing the signal level provided by the RF filter in response to a signal at a reference frequency.

Microcontroller 31 obtains the detected signal level from DSP block 27 and compares it to the prior maximum signal level and possibly to the immediately preceding signal level from the immediately preceding control voltage $V_{control}$ setting. FIG. 5 illustrates a preferred search method employed by microcontroller 31 to locate the maximum signal strength. After obtaining a signal strength level at an initial setting, the control voltage is arbitrarily increased one step and the resulting signal strength level compared to the prior value. The actual relationship between control voltage $V_{control}$ and the resulting signal strength level is shown at curve 60. If the initial step change in the contol signal causes a decrease in resulting signal strength level, as shown in 61, the stepping direction is reversed and the control voltage is decreased. Trials at several decreasing control voltages are conducted by microcontroller 31 until the signal strength level again decreases as shown at 62, preferably decreasing for at least two consecutive steps. The maximum signal level detected is then taken to be the absolute maximum and the control voltage $V_{control}$ at that point is noted along with the reference frequency employed in the trial.

Figure 6:
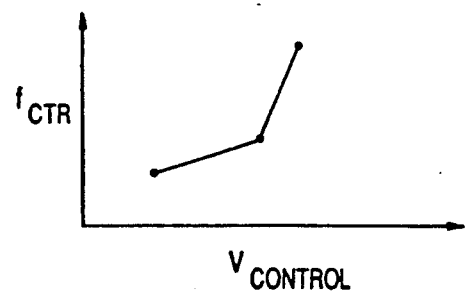
FIG. 6 shows a plot of a preferred function for relating filter control voltage to a desired carrier frequency of a received radio signal, i.e., filter center frequency.

Alignment at a single frequency may be sufficient to fix the response curve shown in FIG. 3 for all frequencies within the band of interest. However, it is preferable to more accurately define the response curve for the individual RF filter by conducting trials at at least three frequencies within the band of interest as shown in FIG. 6. Following the alignment at the plurality of frequencies, the microcontroller reconnects the filter input to the receiving antenna and thereafter determines the control voltage $V_{control}$ for the variable frequency RF filter based on the curve found in FIG. 6 which can be stored in a lookup table.

Figure 7:
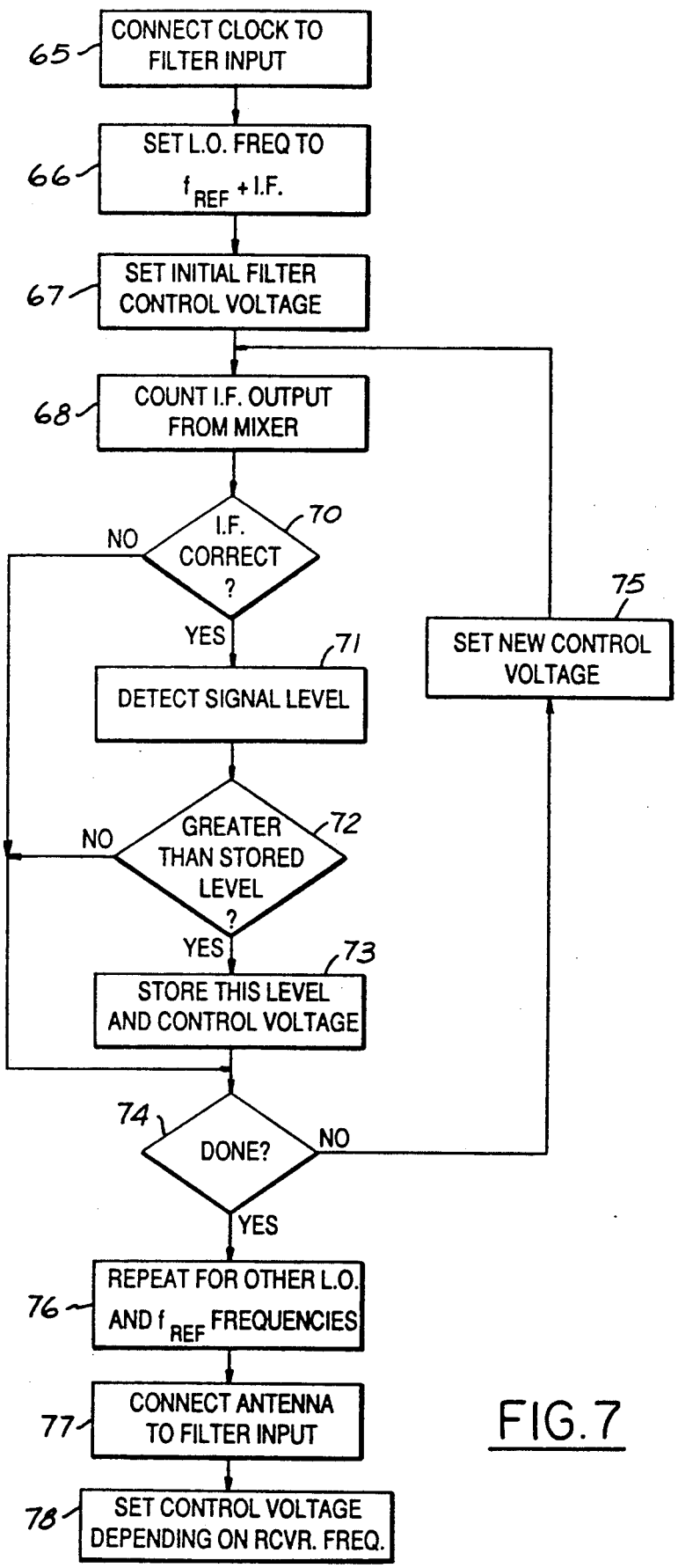
FIG. 7 is a flow chart according to a preferred embodiment of the method of the present invention.

Turning now to FIG. 7, a preferred method of the invention begins at step 65 where the clock reference signal is connected to the input of the variable RF filter. In step 66, the local oscillator frequency is set to the reference frequency plus the intermediate frequency of the receiver so that the mixer output corresponds to the translation of the reference frequency to the intermediate frequency.

In step 67, an initial filter control voltage $V_{control}$ is set. For example, D/A converter 34 may be provided with an output voltage range from zero to 10 volts which in turn controls the tunable range of the variable RF filter. D/A converter 34 may typically provide 256 voltage steps over the 10 volts, thereby providing steps of 39 mV per step. The initial voltage preferably corresponds to the expected value based on the radio design which can be stored in the microcontroller or to the arbitrary selection of a control voltage at the middle of the tunable range of the filter (i.e., five volts).

In step 68, the frequency counter counts the intermediate frequency signal from the IF filter to determine whether or not any actual signal at the reference frequency is being mixed to Produce an IF signal. If a correct IF signal is detected in step 70, then the signal strength level is detected in step 71, otherwise the method proceeds to step 74.

In step 72, the detected signal strength level is compared to a previously stored maximum. If the new level is greater than the previously stored level, then it is stored as the maximum along with the control voltage which produced the maximum. Otherwise, the method proceeds to step 74.

In step 74, a decision is made as to whether the absolute maximum has been located. A determination as to this condition can be obtained, for example, by consecutive steps of the control voltage which resulted in increasing signal strength levels for at least two steps followed by a decrease in signal strength level for at least two steps. Step 74 may also check for the execution of a number of trials above some maximum number which would only occur if some malfunction in the radio were present. If the test for determining the absolute maximum has not been satisfied and if the test for detecting an infinite loop has not been satisfied, a new control voltage is set in step 75 and the method returns to step 68.

Once a maximum has been determined for the Particular reference frequency, the previous steps are repeated for another reference frequency also in or near the frequency band of interest as shown in step 76. Following all the separate frequency alignments and the construction of a table or a calibration function for interpolating various RF frequencies to the proper control voltage setting for the variable RF filter, the filter input is reconnected to the receiver antenna in step 77. Thereafter, the control voltage is set depending on the receiver frequency throughout receiver operation in step 78.

The calibration table or function can preferably be stored in an electronically erasable programmable read-only memory (EEPROM) for permanent storage in association with the individual radio. The alignment procedure may be initiated during final assembly of the radio at the manufacturing plant or subsequently by a user of the receiver by sending an appropriate command to the microcontroller using a pushbutton on the radio, for example. Thus, the RF filter can be realigned if its frequency response changes due to aging or other changing conditions.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A method in a radio receiver for aligning the frequency response of a tunable filter having a center frequency controlled by a control signal, said receiver having a predetermined intermediate frequency and including a digital processor that generates a clock signal, said method comprising the steps of:
    coupling a clock signal from said digital processor to the input of said tunable filter, said clock signal having a frequency within the tunable range of said tunable filter;
    setting said control signal to a plurality of predetermined values;
    mixing the output signal from said tunable filter with a local oscillator signal to provide a respective intermediate frequency signal corresponding to each predetermined control signal value;
    counting the frequency of each respective intermediate frequency signal;
    if a respective counted frequency is substantially equal to said predetermined intermediate frequency then detecting a respective signal strength level of a respective tunable filter output signal;
    identifying the predetermined control signal value corresponding to the maximum respective signal strength level; and
    when receiving a radio broadcast, setting said control signal so as to maximize received signal strength at the frequencies of said radio broadcast.

2. The method of claim 1 wherein said clock signal frequency within said tunable range of said tunable filter is a harmonic frequency.

3. The method of claim 1 wherein said detecting of said signal strength level comprises the steps of digitizing said intermediate frequency signal, separating said digitized signal into in-phase and quadrature components, and calculating the square root of the sum of the squares of said components.

4. The method of claim 3 wherein said in-phase and quadrature components are obtained using a digital Hilbert transform.

5. A radio receiver comprising:
    a tunable filter having a center frequency controllable by a control signal applied at a control input;
    digital processing means for processing a received radio signal, said digital processing means including a clock generating a clock signal;
    switching means coupled to said tunable filter and said digital processing means for selectably coupling either said clock signal or an RF antenna signal to the input of said tunable filter;
    control voltage generator means coupled to said tunable filter for generating said control signal;
    a local oscillator;
    mixer means coupled to the output of said tunable filter and said local oscillator for mixing the output signal of said tunable filter to an intermediate frequency signal;
    counter means coupled to said mixer means for counting the frequency of said intermediate frequency signal;
    level detector means coupled to said mixer means for detecting the magnitude of said intermediate frequency signal; and
    control means coupled to said switching means, said control voltage generator means, said local oscillator, said counter means, and said level detector means for selecting said clock signal for input to said tunable filter, for commanding desired outputs from said control voltage generator means and said local oscillator, for comparing counts from said counter means with a predetermined count, and for monitoring said magnitude from said level detector means to obtain a maximum thereof.

6. The receiver of claim 5 wherein said clock signal includes a harmonic frequency within the tunable range of said tunable filter.

7. The receiver of claim 5 further comprising a crystal filter connected between said mixer means and said counter means and said level detector means.

8. The receiver of claim 5 further comprising:
    analog-to-digital converter means connected between said mixer means and said level detector means for digitizing said intermediate frequency signal;
    said level detector means being included in said digital processing means, said magnitude being determined by applying a Hilbert transform to said digitized intermediate frequency signal to provide in-phase and quadrature components and taking the square root of the sum of squares of said components.

9. The receiver of claim 5 wherein said control means further comprises a memory for storing a control voltage corresponding to a maximum intermediate frequency signal at at least one frequency of said clock signal.

* * * * *